(12) United States Patent
Buh et al.

(10) Patent No.: US 7,492,006 B2
(45) Date of Patent: Feb. 17, 2009

(54) SEMICONDUCTOR TRANSISTORS HAVING SURFACE INSULATION LAYERS AND METHODS OF FABRICATING SUCH TRANSISTORS

(75) Inventors: Gyoung-Ho Buh, Gyeonggi-do (KR); Yu-Gyun Shin, Gyeonggi-do (KR); Sang-Jin Hyun, Gyeonggi-do (KR); Guk-Hyon Yon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 120 days.

(21) Appl. No.: 11/215,217

(22) Filed: Aug. 30, 2005

(65) Prior Publication Data

US 2006/0060929 A1 Mar. 23, 2006

(30) Foreign Application Priority Data

Aug. 30, 2004 (KR) ............... 10-2004-0068656
Jun. 3, 2005 (KR) ............... 10-2005-0047877

(51) Int. Cl.
*H01L 23/62* (2006.01)

(52) U.S. Cl. ............ 257/344; 257/346; 257/327; 257/410

(58) Field of Classification Search ........ 257/346, 257/344, 327, 288, 408, 410, 900
See application file for complete search history.

(56) References Cited

U.S. PATENT DOCUMENTS

| | | | | |
|---|---|---|---|---|
| 5,177,570 A | * | 1/1993 | Tanaka | 257/345 |
| 5,264,380 A | * | 11/1993 | Pfiester | 438/288 |
| 6,429,052 B1 | * | 8/2002 | Gardner et al. | 438/142 |
| 6,451,704 B1 | * | 9/2002 | Pradeep et al. | 438/719 |
| 6,563,151 B1 | | 5/2003 | Shin et al. | |
| 6,630,712 B2 | | 10/2003 | Yu | 257/344 |
| 7,105,889 B2 | * | 9/2006 | Bojarczuk et al. | 257/324 |
| 2003/0075744 A1 | * | 4/2003 | Horita et al. | 257/288 |
| 2005/0253183 A1 | * | 11/2005 | Umezawa et al. | 257/315 |

(Continued)

FOREIGN PATENT DOCUMENTS

JP 05-003206 1/1993

(Continued)

OTHER PUBLICATIONS

Watling, et al., "Impace of High-k Dielectric HfO2 on the Mobility and Device Performance of Sub-100-nm nMOSFETs," IEEE Trans. on Device and Materials Reliability, vol. 5, No. 1, Mar. 2005.*

(Continued)

*Primary Examiner*—Zandra Smith
*Assistant Examiner*—Paul E Patton
(74) *Attorney, Agent, or Firm*—Myers Bigel Sibley & Sajovec

(57) ABSTRACT

Semiconductor devices having a transistor and methods of fabricating such devices are disclosed. The device may include a gate pattern formed on a substrate, spacers formed on sidewalls of the gate pattern, a surface insulation layer that may contact the substrate is interposed between the spacers and the substrate. An inversion layer is provided in the surface region of the substrate under the surface insulation layer. The surface insulation layer is formed of a material generating large quantities of surface states at an interface between the substrate and the surface insulation layer.

32 Claims, 10 Drawing Sheets

U.S. PATENT DOCUMENTS

2005/0280105 A1\* 12/2005 Abdreoni et al. ............ 257/410

FOREIGN PATENT DOCUMENTS

| KR | 10-1998-031851 | \* | 7/1996 |
|----|----------------|----|--------|
| KR | 1998-31851 | | 7/1998 |
| KR | 1998-031851 | \* | 7/1998 |
| KR | 1020020018774 A | | 3/2002 |
| KR | 1020020079267 | | 10/2002 |
| KR | 2003-747 | | 1/2003 |

OTHER PUBLICATIONS

Notice to File a Response/Amendment to the Examination Report in Korean Application No. 10-2005-0047877; date of mailing Aug. 24, 2006.

English translation of Notice to File a Response/Amendment to the Examination Report in Korean Application No. 10-2005-0047877; date of mailing Aug. 24, 2006.

\* cited by examiner

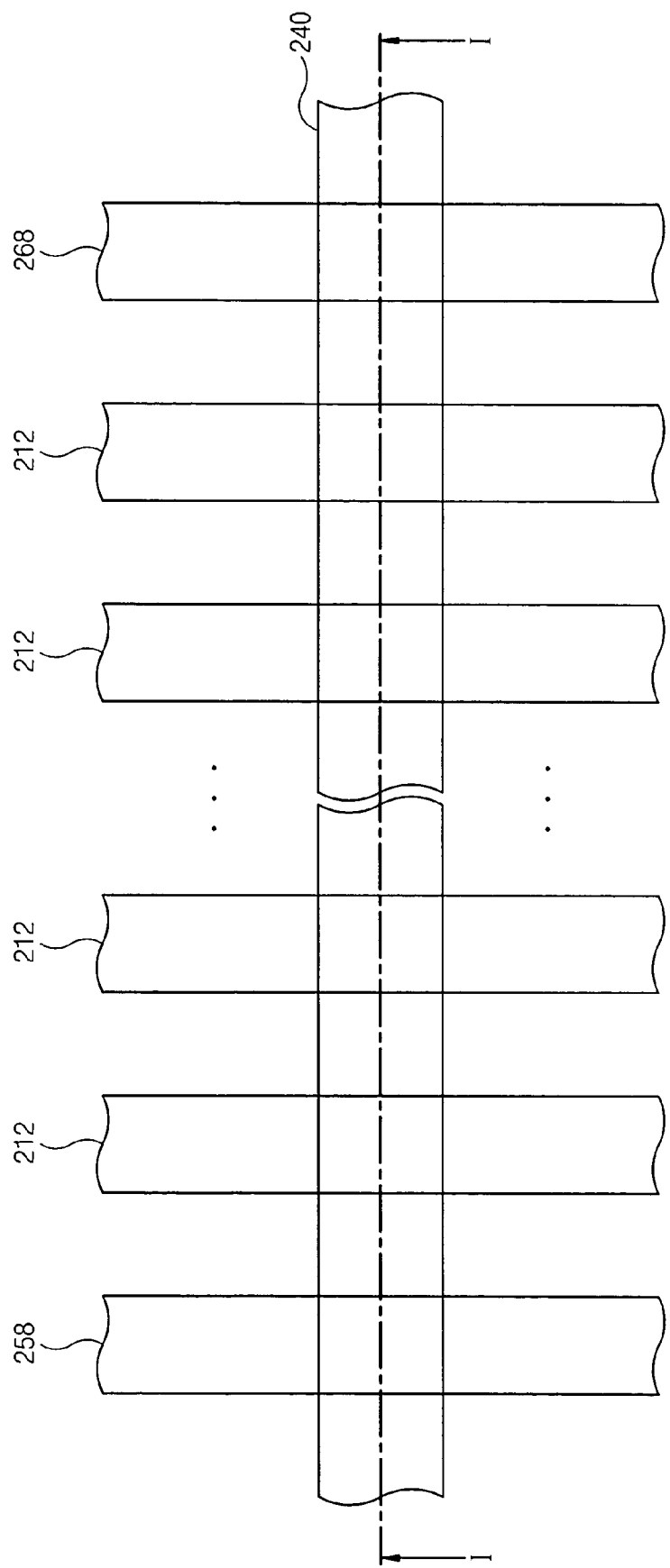

US 7,492,006 B2

SEMICONDUCTOR TRANSISTORS HAVING SURFACE INSULATION LAYERS AND METHODS OF FABRICATING SUCH TRANSISTORS

CROSS-REFERENCE TO RELATED APPLICATIONS

This application claims priority under 35 U.S.C. § 119 from Korean Patent Application No. 2004-68656, filed on Aug. 30, 2004 and from Korean Patent Application No. 2005-47877, filed Jun. 3, 2005, the disclosures of which are hereby incorporated by reference herein in their entirety as if set forth fully herein.

FIELD OF THE INVENTION

The present invention relates to semiconductor devices and, in particular, to semiconductor transistors and methods of fabricating semiconductor transistors.

BACKGROUND OF THE INVENTION

Semiconductor transistors typically include source/drain regions that are spaced apart from each other in a semiconductor substrate, as well as a gate pattern that is disposed over the channel region that separates the spaced apart source/drain regions. The source/drain regions may be formed as lightly doped drain (LDD) regions in order to minimize a phenomena known as hot carrier effect.

FIG. 1 is a cross-sectional diagram that illustrates a method for fabricating a conventional semiconductor transistor that has an LDD structure.

As shown in FIG. 1, the transistor includes a gate pattern 5 that is formed on a semiconductor substrate 1. The gate pattern includes a gate oxide film 2, a gate electrode 3 and a capping pattern 4 that are sequentially stacked. After the gate pattern is formed, impurity ions may be injected at a relatively low dose into the semiconductor substrate 1 using the gate pattern 5 as a mask, thereby forming first and second low-concentration impurity-doped regions 6 in the semiconductor substrate 1.

After the region 6 is formed, spacers 7 may be formed on sidewalls of the gate pattern 5. Thereafter a relatively high dose of impurity ions may be injected into the semiconductor substrate 1 using the gate pattern 5 and the spacers 7 as an implantation mask to thereby form first and second high-concentration impurity-doped regions 8 in the semiconductor substrate 1. The first low and high-concentration impurity-doped regions 6, 8 form a first source/drain region 9 and the second low and high-concentration impurity-doped regions 6, 8 form a second source/drain region 9. The low and high-concentration impurity-doped regions 6, 8 may be thermally treated to activate the impurities after the ion implantation process.

In conventional transistors such as the transistor depicted in FIG. 1, the line width of the gate pattern 5 is typically made very small in order to increase the integration level of the semiconductor device in which the transistor is provided. As the line width is reduced, a phenomena known as "short channel effect" may occur that may deteriorate the characteristics of the transistor. Although the impact of the short channel effect may be reduced by forming the transistor to have an LDD architecture in which the shallow, low-concentration impurity-doped region 6 is provided on each end of the channel region, the LDD architecture may not completely solve the short channel effect problem because the shallowly implanted impurities in the low-concentration impurity-doped region 6 may diffuse during subsequent thermal processes.

SUMMARY

Pursuant to some embodiments of the present invention, semiconductor devices are provided which include a gate pattern on a substrate, a surface insulation layer on the substrate, a spacer on the surface insulation layer and on a sidewall of the gate pattern and an inversion layer in a surface region of the substrate under the surface insulation layer. The surface insulation layer comprises a material that generates surface states at an interface between the substrate and the surface insulation layer.

In these devices, the surface insulation layer may be directly on the substrate under the spacer. If the substrate is a P-type substrate, the surface insulation layer may comprise a material that generates surface states that electrically inverse (i.e., cause an inversion in) the P-type substrate such as, for example, Hf-rich hafnium oxide, Zr-rich zirconium oxide, and/or silicon nitride. If the substrate is an N-type substrate, the surface insulation layer may comprise a material that generates surface states that electrically inverse the N-type substrate such as, for example, Al-rich aluminum oxide.

In certain embodiments, the spacer may comprise an insulation material that has a dielectric constant that is lower than a dielectric constant of the surface insulation layer. The semiconductor device may also include an impurity-doped region in the substrate at a side of the gate pattern, and the inversion layer may be between, and electrically connected to, the impurity-doped region and a channel region under the gate pattern. The surface insulation layer may extend laterally onto the impurity-doped region. In some embodiments, the surface insulation layer and the inversion layer may extend laterally along the surface of the substrate opposite the gate pattern so as to extend laterally beyond the spacer. The gate pattern may comprise, for example, a tunnel insulation pattern, a charge storage pattern, a blocking insulation pattern, and a control gate electrode that are sequentially stacked on the substrate. The surface insulation layer may have a thickness, for example, in the range of about 3 angstroms to about 30 angstroms.

Pursuant to further embodiments of the present invention, semiconductor transistors are provided that include a gate pattern on a semiconductor layer, a surface insulation layer directly on at least a portion of the semiconductor layer, a first spacer on the surface insulation layer and on a first sidewall of the gate pattern and a first source/drain region that comprises a first inversion layer in the semiconductor layer under the first spacer. In these transistors, the surface insulation layer may comprise, for example, Hf-rich hafnium oxide, Zr-rich zirconium oxide, silicon nitride and/or Al-rich aluminum oxide. The surface insulation layer may comprise a material that generates surface states at an interface between the semiconductor layer and the surface insulation layer. The semiconductor layer may comprise a silicon substrate.

The first source/drain region may further include a first impurity-doped region in the semiconductor layer that is electrically connected to a channel region in the semiconductor layer through the first inversion layer. The surface insulation layer may have a thickness in the range of about 3 angstroms to about 30 angstroms. The first source/drain region may, in some embodiments, consist essentially of the first inversion layer. The first spacer may comprise an insulation material having a dielectric constant that is lower than a dielectric constant of the surface insulation layer.

Pursuant to still further embodiments of the present invention, semiconductor devices are provided that include a gate pattern on a substrate, a Hf-rich hafnium oxide, Zr-rich zirconium oxide, silicon nitride and/or Al-rich aluminum oxide surface insulation layer directly on at least a portion of the substrate, a spacer that has a dielectric constant that is lower than a dielectric constant of the surface insulation layer on the surface insulation layer and on a first sidewall of the gate pattern, and a source/drain region under the first spacer.

In these semiconductor devices, the source/drain region may comprise an inversion layer in the substrate that results from surface states generated by the surface insulation layer at the interface between the substrate and the surface insulation layer. The source/drain region may also include an impurity-doped region in the semiconductor layer that is electrically connected to a channel region in the substrate through the inversion layer. The surface insulation layer may have a thickness in the range of about 3 angstroms to about 30 angstroms. The source/drain region may consist essentially of the inversion layer.

Pursuant to still further embodiments of the present invention, methods of fabricating semiconductor device are provided. Pursuant to these methods, a gate pattern is formed on a substrate. A surface insulation layer is formed directly on the substrate at a side of the gate pattern. A spacer is formed on a sidewall of the gate pattern and on the surface insulation layer. The surface insulation layer is formed of a material that generates surface states at an interface between the substrate and the surface insulation layer so that an inversion layer is formed in a surface region of the substrate under the surface insulation layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings:

FIG. 8 is a plan view diagram of a NAND flash memory device that includes semiconductor transistors according to embodiments of the present invention;

DETAILED DESCRIPTION

Figure 1:
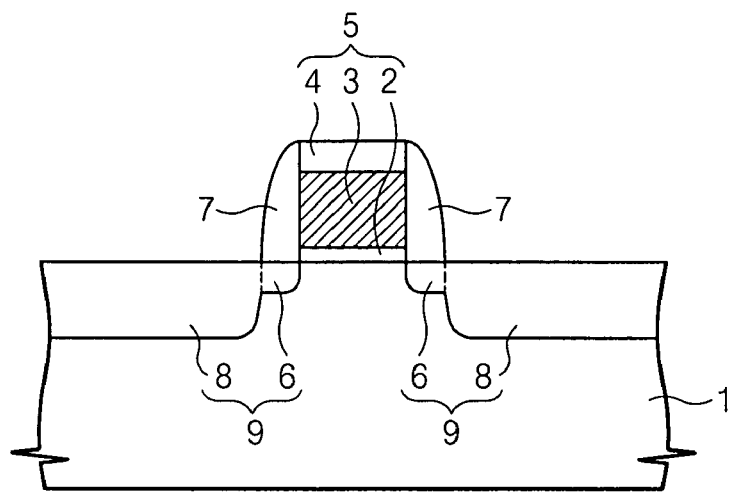
FIG. 1 is a cross-sectional diagram of a conventional semiconductor transistor that has an LDD structure.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-sectional illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIRST EMBODIMENTS

Figure 2:
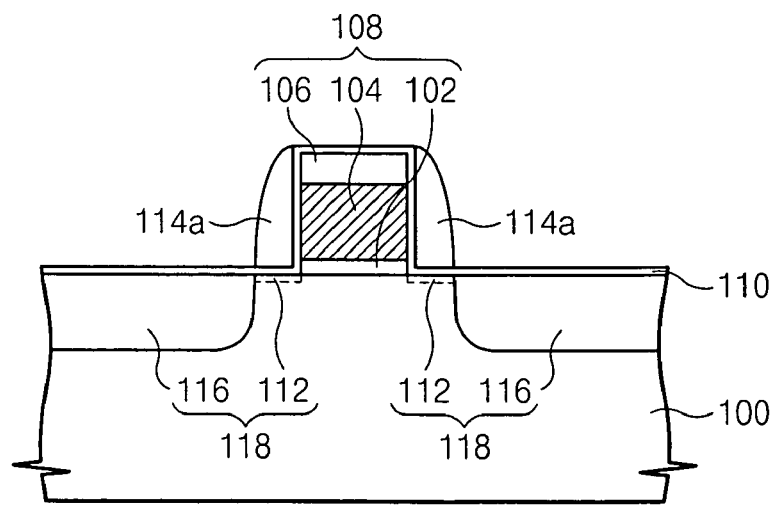
FIG. 2 is a cross-sectional diagram illustrating a semiconductor transistor according to first embodiments of the present invention.

FIG. 2 is a cross-sectional diagram illustrating a semiconductor transistor according to first embodiments of the present invention. As shown in FIG. 2, a gate pattern 108 is formed on a semiconductor substrate (hereinafter, referred to as a "substrate") 100. The gate pattern 108 includes a gate insulation pattern 102, a gate electrode 104 and a capping pattern 106 which are sequentially stacked on the substrate 100. The gate insulation pattern 102 may comprise, for example, as a silicon oxide film, specifically a thermal oxide film. The gate electrode 104 may comprise a conductive film. For instance, the gate electrode 104 may comprise doped polysilicon or a conductive metal-containing material such as, for example, a metal nitride (e.g., titanium nitride, tantalum nitride, etc.), a metal (tungsten, molybdenum, etc.) and/or a metal silicide (e.g., tungsten silicide, titanium silicide, cobalt suicide, nickel silicide, etc.). The capping pattern 106 may be formed of an insulation (or dielectric) material, such as, for example, silicon oxide or silicon nitride.

Spacers 114a are disposed on both sidewalls of the gate pattern 108. A surface insulation layer 110 is interposed between the spacers 114a and the substrate 100. The surface insulation layer 110 may be in direct contact with the substrate 100. The surface insulation layer 110 may generate large quantities of states at the interface between the substrate 100 and the surface insulation layer 110. The interface states cause an inversion at the interface between the substrate 100 and the surface insulation layer 110. As a result, an inversion layer 112 is generated under the surface insulation layer 110 through pinning of the Fermi level in the substrate 100 by the surface states. When an operation voltage is applied to the gate electrode 106 to form a channel under the gate pattern 108, the inversion layer 112 is electrically conductive with the channel.

The charge density in the inversion layer 112 is dependent on the density of the surface states. As such, the resistance of the inversion layer 112 is also dependent on the density of the surface states. As the density of the surface states increases, the charge density in the inversion layer 112 may increase, and the resistance of the inversion layer 112 is correspondingly decreased. Likewise, as the density of the surface states decreases, the charge density in the inversion layer 112 may decrease and the resistance of the inversion layer 112 increases. The density of the surface states may be independent of the thickness of the surface insulation layer 110. As such, the surface insulation layer 110 may be formed to be very thin. For example, the surface insulation layer 110 may be formed to have a thickness in the range of about several angstroms to about several tens of angstroms.

When the substrate 100 is a P-type substrate (as would be the case when the transistor is an NMOS transistor), the surface insulation layer 110 may be formed of a material generating the surface states that inverse the surface of the P-type substrate 100. By way of example, for a P-type substrate, the surface insulation layer 110 may be made of Hf-rich hafnium oxide, Zr-rich zirconium oxide, or silicon nitride. The larger the amount of Hf in the hafnium oxide, the higher the density of the surface states. The smaller the amount of Hf in the hafnium oxide, the lower the density of the surface states. Similarly, the larger the amount of Zr in the zirconium oxide, the higher the density of the surface states. The smaller the amount of Zr in the zirconium oxide, the lower the density of the surface states.

In contrast, when the substrate 100 is an N-type substrate (as would be the case when the transistor is a PMOS transistor), the surface insulation layer 110 may be formed of a material generating the surface states that inverse the surface of the N-type substrate 100. By way of example, for an N-type substrate, the surface insulation layer 110 may be made of Al-rich aluminum oxide. The larger the amount of Al in the aluminum oxide, the higher the density of the surface states. The smaller the amount of Al in the aluminum oxide, the smaller the density of the surface states.

As shown in FIG. 2, the ends of the surface insulation layer 110 adjacent to the gate pattern 108 may be extended to be interposed between the sidewalls of the gate pattern 108 and the spacers 114a. The surface insulation layer may also be further extended to cover the gate pattern 108. Thus, in certain embodiments of the present invention, the surface insulation layer 110 may conformably cover the both sidewalls and the top of the gate pattern 108. In other embodiments of the present invention, the surface insulation layer 110 may, for example, only be provided between the spacers 114 and the substrate 100.

Impurity-doped regions 116 may be formed in the substrate 100 on both sides of the gate pattern 108. Each such impurity-doped region 116 may be electrically connected to the end of one of the inversion layers 112. In other words, an inversion layer 112 is interposed between the channel and each of the impurity-doped regions 116, electrically connecting the channel and each of the impurity-doped regions 116. Each impurity-doped region 116 may be aligned to a spacer 114a. Each inversion layer 112 and the impurity-doped region 116 that it is connected to form a source/drain region 118. The inversion layers 112 may have a resistance that is similar to or larger than the resistance of the impurity-doped regions 116. Thus, the source/drain regions 118 may be formed to have the structure of an LDD source/drain or an extended source/drain. As illustrated in FIG. 2, the ends of the surface insulation layer 110 opposite the gate pattern 108 may be laterally extended to be disposed on the impurity-doped regions 116. In this case, respective contact holes (not shown) may be provided that that penetrate an interlevel insulation film (not shown) and the surface insulation layer 110 to expose the impurity-doped regions 116.

The spacer (or spacers) 114a may comprise an insulation (or dielectric) material that has a small dielectric constant relative to the dielectric constant of the surface insulation layer 110. For example, the spacer 114a may contain an insulation material that has a dielectric constant that is identical to or lower than the dielectric constant of a silicon oxide (e.g., silicon carbide or silicon oxy-carbide). In addition, the spacer 114a may further contain another insulation material (that may be used, for example, as an etch stopper) on the insulation material that has the relatively small dielectric constant.

In the aforementioned transistor, the low-concentration or extended region of the source/drain region 118 comprises the inversion layer 112 provided by the surface insulation layer 110. The inversion layer 112 may be very thin such as, for example, less than about 30 angstroms. As a result, the short channel effect can be reduced and/or minimized.

As noted above, the inversion layer 112 may be formed from the surface states induced by the surface insulation layer 110, where the density of the surface states may be independent of the thickness of the surface insulation layer 110. Thus, the surface insulation layer 110 may be very thin. As a result, the surface insulation layer 110 may have little impact in terms of the physical stress applied to the substrate 100. And, although a dielectric constant of the surface insulation layer 110 is higher, the values of parasitic capacitances between the gate electrode 104 and the source/drain region 118, and between adjacent gate electrodes 104, can be reduced in certain embodiments of the present invention. As a result, it may be possible to reduce the characteristic deterioration in turning the transistor on or off due to the parasitic capacitance between the gate electrode 104 and the source/drain region 118. It also may be possible to reduce the delay time in operating the transistor due to the parasitic capacitance between the adjacent gate electrodes 104.

In addition, as the spacer 114a include a low-dielectric insulation material, it further restrains the parasitic capacitances between the gate electrode 104 and the source/drain region 118, and/or between the adjacent gate electrodes 104.

Figure 3:
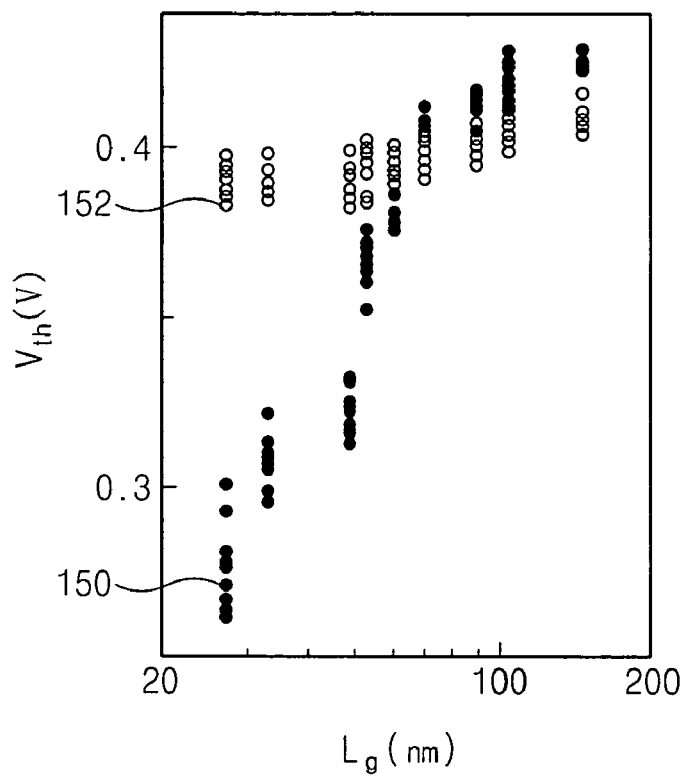
FIG. 3 is a graph illustrating the threshold-voltage distribution profile of a transistor according to the first embodiment of the present invention.

An experiment for inspecting certain characteristics of the transistor according to the first embodiments of the present invention resulted in the data shown in FIG. 3. In particular, FIG. 3 is a graph showing the threshold-voltage distribution profile of a transistor according to the first embodiments of the present invention.

Referring to FIGS. 1, 2, and 3, the experiment was carried out using a first group of transistors and a second group of transistors. The first group of transistors were conventional transistors having the low and high-concentration doped regions 6, 8 depicted in FIG. 1. The thickness of the transistors in the first group was about 17 angstroms. The low and high-concentration doped regions 6, 8 in the transistors of the first group were doped with arsenic ion doses of $3*10^{15}$ and $5*10^{15}$ ions/cm$^3$. In the first group, transistors having nine different channel lengths were measured (with approximately eight transistors for each different channel length).

The second group of samples comprised transistors formed in accordance with the first embodiments of the present invention. The gate insulation patterns 102 of the transistors in the second group of samples were formed to a thickness of about 17 angstroms. The surface insulation layers 110 of the transistors in the second group of samples were formed of silicon nitride films having a thickness of about 20 angstroms. The impurity-doped regions in the transistors of the second group of samples were formed with arsenic ions doses of $5*10^{15}$ ions/cm$^3$.

In the graph of FIG. 3, the horizontal axis represents the channel lengths of the transistors (using a logarithmic scale) while the vertical axis represents the threshold voltages of the transistors. The filled circles labeled 150 on the graph of FIG. 3 denote the threshold voltage values of the transistors in the first group of samples while the unfilled circles 152 denote the threshold voltage values of the transistors in the second group of samples.

As shown in the graph of FIG. 3, as the channel length of the conventional transistors (the transistors in the first group of samples) is reduced below about 60 nm, the threshold voltage of the transistor rapidly falls due to the short channel effect. In contrast, with the transistors formed in accordance with the first embodiments of the present invention (the transistors in the second group of samples), the threshold voltages remains relatively constant even after the channel length is reduced below about 60 nm.

A second experiment was performed in which the thickness of the surface insulation layer 110 was altered. In this experiment, a set of transistors (the third group of samples) was provided in which the surface insulation layers 110 were formed of silicon nitride films having a thickness of 5 angstroms, and a set of transistors (the fourth group of samples) was provided in which the surface insulation layers 110 were formed of silicon nitride films having a thickness of 10 angstroms. Otherwise, the transistors of the third and fourth groups of samples were identical to the transistors of the second group of samples. The channel lengths of the transistors in the third and fourth groups of samples were 22 nm. Drain currents were measured for the transistors in the second group of samples having 22 nm channel lengths, as well as for the transistors in the third and fourth groups of samples, when 1.2V was applied to the gate electrodes 104, 1.2V was applied to the drain regions 118, and a ground voltage was applied to the source regions 118. The drain currents in the second, third and fourth groups of samples were all found to be about $2*10^{-4}$ A/μm. Thus, the results of the experiments indicate that the thickness of the surface insulation layer 110 may be irrelevant to the charge density (i.e., resistance) of the inversion layer 112. As such, the surface insulation layer 110 may be formed to have a very small thickness, e.g., from about several angstroms through about several tens of angstroms.

Figure 4:
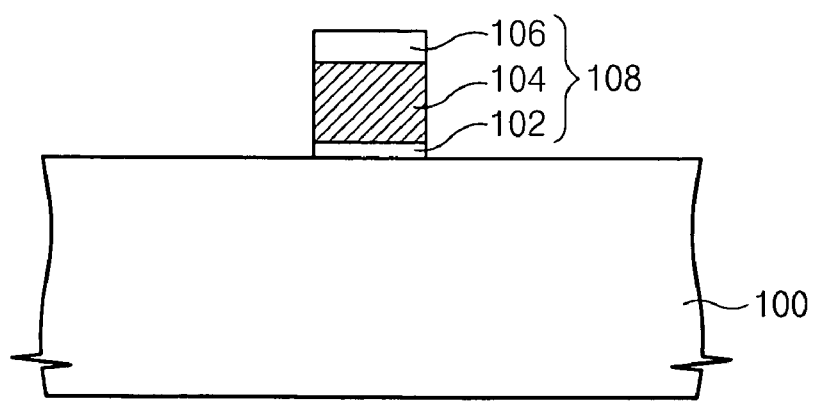
FIGS. 4 through 6 are cross-sectional diagrams illustrating processing steps for fabricating an exemplary semiconductor transistor in accordance with the first embodiments of the present invention.
Figure 5:
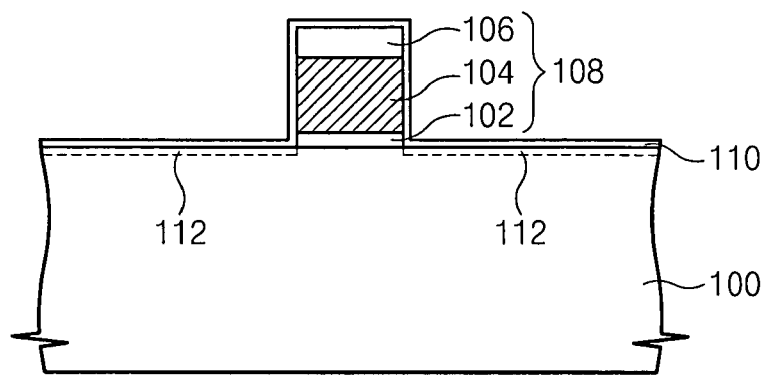
Figure 6:
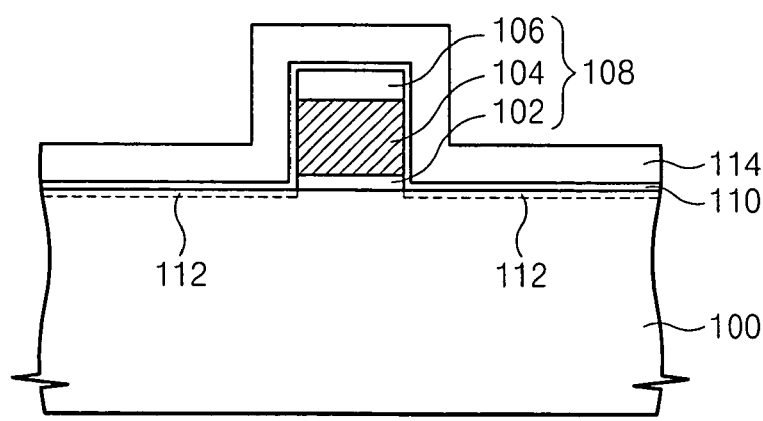

FIGS. 4 through 6 are cross-sectional diagrams illustrating processing steps for fabricating semiconductor transistors in accordance with the first embodiments of the invention. As shown in FIG. 4, a gate insulation film 102, a gate conductive film 104 and a capping film 106 are sequentially formed on a substrate 100 and patterned to form a gate pattern 108. The gate pattern 108 is composed of the gate insulation pattern 102, the gate electrode 104, and the capping pattern 106. A field isolation film (not shown) may be formed in or on the substrate 100 to confine active regions before depositing the gate insulation film. The gate pattern 108 intersects an active region.

The upper surface of the substrate at both sides of the gate pattern 108 is exposed. This may be done, for example, during the formation of the gate pattern 108 or may be accomplished by removing the gate insulation film remaining on the substrate 100 at both sides of the gate pattern 108 after the gate pattern 108 is formed.

The gate insulation pattern 102 may comprise, for example, a silicon oxide film, specifically a thermal oxide film. The gate electrode 104 may comprise, for example, doped polysilicon and/or a conductive metal-containing material. Exemplary conductive metal-containing materials that may be used to form all or part of the gate electrode include conductive metal nitrides (e.g., titanium nitride, tantalum nitride, etc.), metals (tungsten, molybdenum, etc.), and/or metal silicides (e.g., tungsten silicide, titanium suicide, cobalt silicide, nickel suicide, etc.). The capping pattern 106 may be formed of an insulation (or dielectric) material, such as, for example, silicon oxide or silicon nitride.

A surface insulation layer 110 is also formed on the substrate 100. As shown in FIG. 5, the surface insulation layer 110 may be conformably formed directly on the substrate 100 at both sides of the gate pattern 108. The surface insulation layer 110 may be formed of a material generating surface states at an interface between the substrate 100 and the surface insulation layer 110. The interface states may cause an inversion at the surface of the substrate 100 under the surface insulation layer 110, generating an inversion layer 112 therein. The resistance of the inversion layer 112 may be a function of the density of the surface states, and may be independent of the thickness of the surface insulation layer 110. Thus, the surface insulation layer 110 may, in exemplary embodiments of the present invention, be formed to have a small thickness in the range of, for example, about several angstroms through about several tens of angstroms. As is also shown in FIG. 5, the surface insulation layer 110 may also be formed on the top and sidewalls of the gate pattern 108. In other exemplary embodiments, the surface insulation layer 110 may be formed only on the substrate 100 at each side of the gate pattern 108.

When the substrate 100 is a P-type-substrate, the surface insulation layer 110 includes a material generating the surface states that inverse the surface of the P-type substrate 100. In exemplary embodiments of the present invention, the surface insulation layer 110 may comprise Hf-rich hafnium oxide, Zr-rich zirconium oxide, or silicon nitride. The resistance of a Hf-rich hafnium oxide inversion layer 112 (i.e., the electron density in the inversion layer 112) may be controlled by the quantity of hafnium in the Hf-rich hafnium oxide. Likewise, the resistance of a Zr-rich zirconium oxide inversion layer 112 may be controlled by the quantity of zirconium in the Zr-rich zirconium oxide.

The surface insulation layer 110 may be formed, for example, via chemical vapor deposition or atomic layer deposition, rapid thermal nitrification, plasma nitrification or ion implantation. The processing technique used may be selected based on the material(s) used to form the surface insulation layer 110.

When the substrate 100 is an N-type substrate, the surface insulation layer 110 includes a material generating the surface states that inverse the surface of the N-type substrate 100. For example, in certain embodiments of the present invention, the surface insulation layer 110 used on an N-type substrate may comprise Al-rich aluminum oxide. The resistance of an Al-rich aluminum oxide inversion layer 112 may be controlled by varying the quantity of aluminum, and may be formed by, for example, chemical vapor deposition or atomic layer deposition.

As shown in FIG. 6, a spacer film 114 may be formed on the substrate 100 and the surface insulation layer 110. The spacer film 114 may comprise an insulation (or dielectric) material that has a small dielectric constant relative to the dielectric constant of the surface insulation layer 110. For example, the spacer film 114 may comprise an insulation material having a dielectric constant that is identical to or lower than the dielectric constant of a silicon oxide (e.g., silicon carbide or silicon oxy-carbide). In some case, the spacer film 114 may further contain another insulation material that may be used, for example, as an etch stopper on the low-dielectric constant insulation material.

The spacer film 114 may be un-isotropically etched away to form the spacers 114a shown in FIG. 2. Impurity ions may then be injected into the substrate 116 using the gate pattern 108 and the spacers 114a as an ion implantation mask to form the impurity-doped regions 116. The inversion layers 112 and the impurity-doped regions 116 are parts of the source/drain regions 118 shown in FIG. 2. The surface insulation layer 110 may partially remain on the impurity-doped regions 116, or may be removed therefrom after forming the spacers 114a.

In the above-described method of fabricating semiconductor transistors, the implantation of a low dose of impurity ions may be omitted, as the region 6 of the conventional semiconductor transistor of FIG. 1 may be replaced by the surface insulation layer 110 that generates the inversion layer 112. As the surface insulation layer 110 may be very thin, the parasitic capacitances (1) between the gate electrode 104 and the source/drain region 118 and (2) between adjacent gate electrodes 104 can be kept to acceptable levels. In addition, as the spacer 114a includes a low-dielectric insulation material, it may further restrain the parasitic capacitances.

SECOND EMBODIMENTS

Figure 7A:
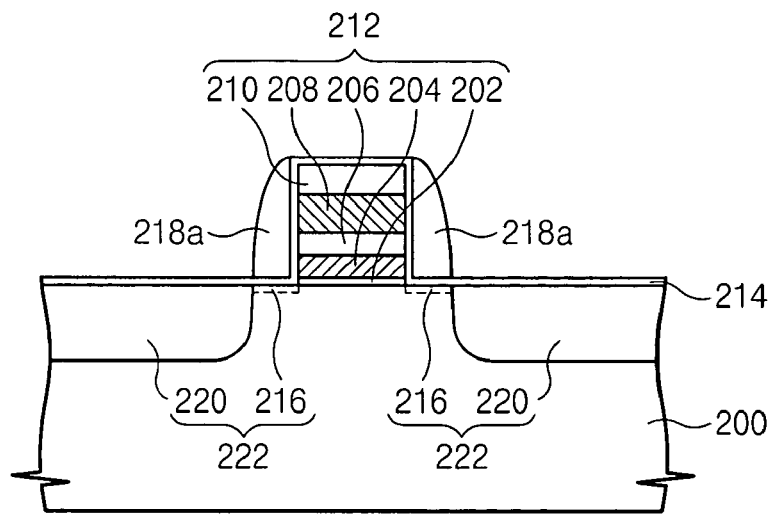
FIG. 7A is a cross-sectional diagram illustrating a semiconductor transistor according to second embodiments of the present invention.
Figure 7B:
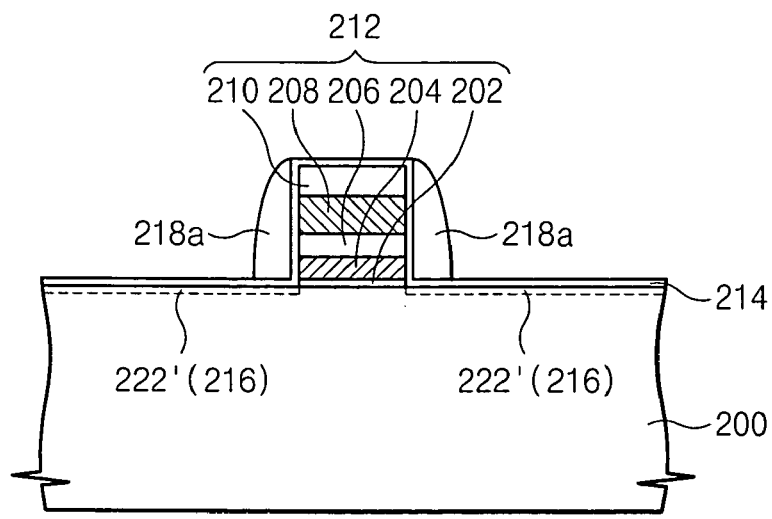
FIG. 7B is a cross-sectional diagram illustrating another semiconductor transistor according to second embodiments of the present invention.

FIG. 7A is a cross-sectional diagram illustrating a semiconductor transistor in accordance with second embodiments of the present invention. FIG. 7B is a cross-sectional diagram illustrating a second semiconductor transistor in accordance with the second embodiments of the present invention. The semiconductor transistors according to the second embodiments of the present invention may be used, for example, as cell transistors of a flash memory device.

As shown in FIG. 7A, a gate pattern 212 is formed on a substrate 200. The gate pattern 212 includes a tunnel insulation pattern 202, a charge storage pattern 204, a blocking insulation pattern 206, a control gate electrode 208, and a capping pattern 210, which are stacked sequentially. The gate pattern 212 intersects an active region that may be provided between field isolation regions (not shown) that are formed in the substrate 200. The charge storage pattern 204 accumulates charges. In certain embodiments, the charge storage pattern 204 may be a floating gate in which charges are accumulated in the form of free electrons. In other embodiments, the charge storage pattern 204 may be a trap insulation film that stores charges in traps with high potentials.

The tunnel insulation pattern 202 may comprise, for example, a silicon oxide film, specifically, a thermal oxide film. If the charge storage pattern 204 is used as a floating gate, it may comprise, for example, doped polysilicon. If the charge storage pattern 204 is used as the trap insulation film, it may comprise, for example, silicon nitride. The blocking insulation film 206 may comprise an insulation film such as, for example, a silicon oxide or oxide-nitride-oxide (ONO) layer that minimizes charge leakage between the charge storage pattern 204 and the control gate electrode 208. The control gate electrode 208 may comprise a conductive film, such as, for example, a doped polysilicon film and/or a conductive metal-containing material. Examples of suitable conductive metal-containing materials are described above with respect to the gate electrode 104 of the transistors according to the first embodiments of the present invention. The capping pattern 210 may comprise an insulation film, such as, for example, a silicon oxide film or a silicon nitride film.

As shown in FIG. 7A, spacers 218a are disposed on both sidewalls of the gate pattern 212. A surface insulation layer 214 is provided between the spacers 218a and the substrate 200. The surface insulation layer 214 may be formed directly on the substrate 200, and may be formed of a material that generates a plurality of surface states at the interface between the substrate 200 and the surface insulation layer 214. These surface states induce an inversion layer 216 in the substrate 200 under the surface insulation layer 214. The inversion layer 216 is electrically connected to the channel that exists under the gate pattern 212.

As the density of the surface states increases, the charge density of the inversion layer 216 increases and the resistance of the inversion layer 216 is correspondingly reduced. As in the first embodiment, the surface insulation layer 214 may be made very thin (e.g., several angstroms to several tens of angstroms) without impacting the density of the surface states.

When the substrate 200 is a P-type substrate, the surface insulation layer 214 may be formed of a material generating the surface states that inverse the surface of the P-type substrate 100. For example, the surface insulation layer 214 may comprise Hf-rich hafnium oxide, Zr-rich zirconium oxide, or silicon nitride. When, on the other hand, the substrate 200 is an N-type substrate, the surface insulation layer 214 may be formed of a material generating the surface states that inverse the surface of the N-type substrate 200 such as, for example, Al-rich aluminum oxide. As with the transistors of the first embodiments of the present invention, the resistance of the inversion layer 214 can be controlled by adjusting the amount of Hf, Zr, or Al in, respectively, the Hf-rich hafnium oxide film, the Zr-rich zirconium oxide film, or the aluminum oxide film.

The ends of the surface insulation layer 214 which are adjacent to the gate pattern 212 may be extended to be interposed between the sidewall of the gate pattern 212 and the spacer 218a and/or to cover the top of the gate pattern 212. In other exemplary embodiments, the surface insulation layer 214 may only be provided between the spacer 218a and the substrate 200.

As is also shown in FIG. 7A, impurity-doped regions 220 are provided in the substrate 200 at each side of the gate pattern 212. The impurity-doped regions 220 are each electrically connected to the inversion layer 214. The impurity-doped regions 220 may be aligned with respective of the spacers 218a. The inversion layer 214 and each impurity-doped region 220 constitute a source/drain region 222. The source/drain regions 222 may be formed in the structure of LDD in that the inversion layer 216 has a resistance that is higher than the resistance of the impurity-doped regions 220. Alternatively, the source/drain regions 222 may have the structure of an extended source/drain in which the inversion layer 216 has a resistance that is similar to the resistance of the impurity-doped region 220.

As is also illustrated in FIG. 7A, the ends of the surface insulation layer 214 that are opposite to the gate pattern 212 may be laterally extended to cover the impurity-doped regions 220. In such embodiments, contact holes that expose the impurity-doped regions 220 may be provided that penetrate the surface insulation layer 214 and an interlevel insulation film (not shown in FIG. 7A). The surface insulation layer 214 may alternatively not be extended onto the impurity-doped regions 220.

As with the spacers 214a of the transistors of the first embodiments of the present invention, the spacer(s) 218a may include an insulation (or dielectric) material that has a small dielectric constant relative to the dielectric constant of the surface insulation layer 214.

The above-described transistor may be used, for example, as the cell transistor of a NOR-type or a NAND-type flash memory device.

In the transistor of FIG. 7A, the surface insulation layer 214 generates the inversion layer 216 under the spacer 218a. The inversion layer 216 may have a thickness of, for example, about 30 angstroms or less. Deterioration due to the short channel effect can be reduced and/or minimized even when the transistor has a very small line width.

Additionally, as discussed above with respect to the transistors of the first embodiment, the surface insulation layer 214 may be very thin in order to reduce the parasitic capacitance (1) between the control gate electrode 208 and the source/drain region 222 and (2) between the control gate electrodes 208. Moreover, in certain embodiments, the parasitic capacitance may be reduced even further by forming the spacers 218a using a low-dielectric insulation material.

FIG. 7B is a cross-sectional diagram of a second transistor according to the second embodiments of the present invention. As shown in FIG. 7B, the source/drain region 222' consists of the inversion layer 216. The surface insulation layer 214 and the inversion layer 216 each extend along the surface of the substrate 200 away from the gate pattern 212. Thus, in the transistor depicted in FIG. 7B, the extended portions of the inversion layer 216 is used in place of the impurity-doped regions 220 in the transistor of FIG. 7A. The transistor of FIG. 7B may be used, for example, in NAND-type flash memory devices.

Figure 9:
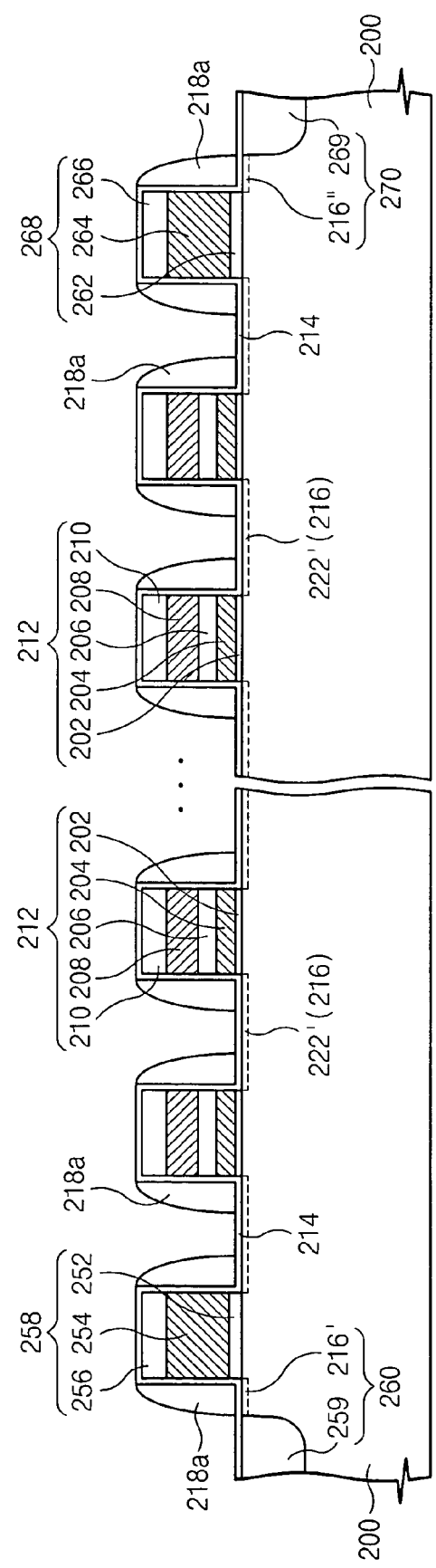
FIG. 9 is a cross-sectional diagram taken along the line I-I' of FIG. 8.

A NAND flash memory device that includes transistors having the structure shown in FIG. 7B as cell transistors will now be described with reference to FIGS. 8 and 9. FIG. 8 is a plan view diagram of the NAND-type flash memory device, and FIG. 9 is a cross-sectional diagram taken along the line I-I' of FIG. 8. FIGS. 8 and 9 illustrate a single cell string that includes a plurality of cell transistors that are connected in series.

As shown in FIG. 8, a field isolation film defines a string active region 240 in the substrate. Spaced apart first and second selection gate patterns 258, 268 that intersect the string active region 240 are provided. The first and second selection gate patterns 258, 268 are disposed in parallel. A plurality of parallel gate patterns 212 are provided between the first and second selection gate patterns 258, 268. The gate patterns 212 comprise part of the cell transistors of the NAND-type flash memory device. Each cell transistor has the structure of the transistor shown in FIG. 7B. When the spacing between the gate patterns 212 is very narrower, the spacers 218a formed on sidewalls of the gate patterns 212 may contact the spacers formed on adjacent gate patterns 212.

As shown in FIG. 9, the first selection gate pattern 258 is comprised of a first selection gate insulation pattern 252, a first selection gate electrode 254, and a first selection capping pattern 256 that are sequentially stacked. The second selection gate pattern 268 is similarly comprised of a second selection gate insulation pattern 262, a second selection gate electrode 264, and a second selection capping pattern 266 that are sequentially stacked. Spacers 218a are disposed on both sidewalls of the selection gate patterns 258 and 268.

The selection gate insulation patterns 252 and 262 may be formed, for example, of silicon oxide. The thickness of the selection gate insulation patterns 252 and 262 may be the same as, or different from, the thickness of the tunnel insulation pattern 202 of the gate patterns 212. The selection gate electrodes 254 and 264 may be formed, for example, using the same material that is used to form the control gate electrodes 208 of the gate patterns 212. When the charge storage pattern 204 is composed of a conductive film, the selection gate electrodes 254 and 264 may further include the same material as the charge storage pattern 204. The selection capping patterns 256 and 266 may be formed, for example, of the same material that is used to form the capping patterns 210 of the gate patterns 212.

A common source region 260 is disposed in the substrate 200 at one side of the first selection gate pattern 258 (the side opposite the cell gate pattern 212). The common source region 260 is comprised of a first selection inversion layer 216' located in the string active region under the spacer 218a that is formed on the sidewall of the first selection gate pattern 252, and a first selection impurity-doped region 259 that is electrically connected to the first selection inversion layer 216'. The surface insulation layer 214 is interposed between the inversion layer 216' and the spacer 218a. The surface insulation layer 214 also extends laterally to cover the first selection impurity-doped region 259 in this particular embodiment.

A common drain region 270 is similarly disposed in the substrate 200 at one side of the second selection gate pattern 268 (the side opposite the cell gate pattern 212). The common drain region 270 is comprised of a second selection inversion layer 216" in the string active region under the spacer 218a that is formed on the sidewall of the second selection gate pattern 268, and a second selection impurity-doped region 269 that is electrically connected to the second selection inversion layer 216". The surface insulation layer 214 is interposed between the second selection inversion layer 216" and the spacer 218a. The surface insulation layer 214 also extends laterally to cover the second selection impurity-doped region 269.

In the cell string of FIGS. 8 and 9, the source and drain voltage may be coupled to the common source and drain regions, 260, 270, respectively. In other words, the source and drain voltages are not applied directly to the source/drain regions 222' of the cell transistors. As contact holes that expose the source/drain regions 222' may be omitted in this particular embodiment, the source/drain regions 222' may be formed exclusively using the inversion layer 216. The NAND memory device of FIGS. 8 and 9 may reduce and/or minimize the short channel effect and may exhibit low parasitic capacitance levels.

Figure 10:
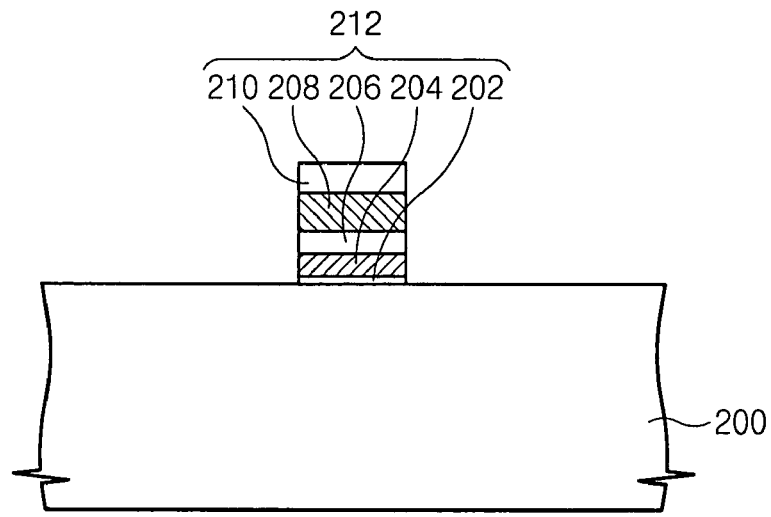
FIGS. 10 through 12 are cross-sectional diagrams illustrating processing steps for fabricating a semiconductor transistor in accordance with second embodiments of the present invention.
Figure 11:
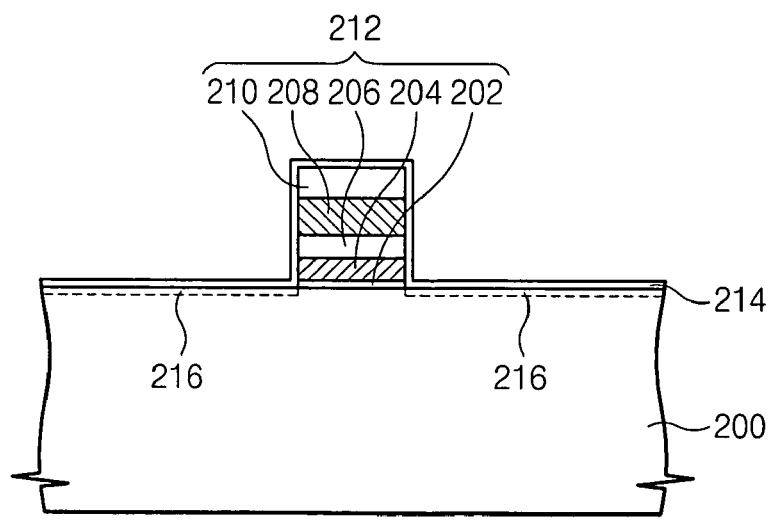
Figure 12:
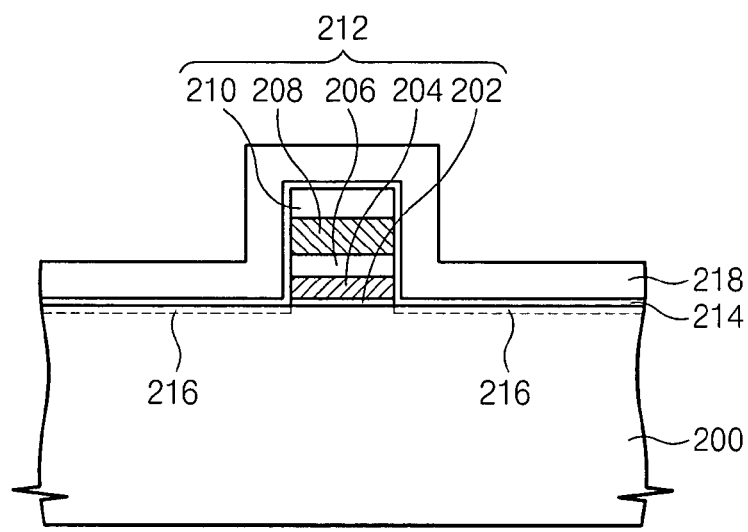

FIGS. 10 through 12 are cross-sectional diagrams illustrating processing steps for fabricating semiconductor transistors in accordance with the second embodiments of the present invention. As shown in FIG. 10, the gate pattern 212 is formed over the substrate 200. The gate pattern 212 includes a tunnel insulation pattern 202, a charge storage pattern 204, a blocking insulation pattern 206, a control gate electrode 208, and a capping pattern 210 that are stacked sequentially. The tunnel insulation pattern 202 may comprise a silicon oxide film, specifically a thermal oxide film. The charge storage pattern 204 may comprise, for example, a doped polysilicon or a silicon nitride film. The blocking insulation film 206 may comprise, for example, a silicon oxide or oxide-nitride-oxide (ONO) layer. The control gate electrode 208 may be formed, for example, of a doped polysilicon and/or a conductive metal-containing material such as the conductive metal-containing material that may be used to form the gate electrode 104 of the transistors according to the first embodiments of the present invention.

After the gate pattern 212 is formed, the substrate at both sides of the gate pattern 212 may be exposed as described above with respect to the transistors according to the first embodiments of the present invention.

As shown in FIG. 11, a surface insulation layer 214 may be conformably deposited directly on the substrate 200 at both sides of the gate pattern 212. The surface insulation layer 214 may be formed of a material generating surface states at an interface between the substrate 200 and the surface insulation layer 214. The interface states cause an inversion at the surface of the substrate 200 under the surface insulation layer 214, generating an inversion layer 216 therein. The surface insulation layer 214 may in certain embodiments, have a thickness in the range of about several angstroms through about several tens of angstroms.

When the substrate 200 is a P-type substrate, the surface insulation layer 214 may be formed of a material generating the surface states that inverse the surface of the P-type substrate 200. For example, the surface insulation layer 214 may be formed of Hf-rich hafnium oxide, Zr-rich zirconium oxide, or silicon nitride. Hf-rich hafnium oxide or the Zr-rich zirconium oxide surface insulation layers 214 may be formed, for example, using chemical vapor deposition or atomic layer deposition techniques. Silicon nitride surface insulation layers 214 may be formed, for example, using chemical vapor deposition, atomic layer deposition, rapid thermal nitrification, plasma nitrification or ion implantation techniques.

As shown in FIG. 12, a spacer film 218 may be conformably deposited on the substrate 200. The spacer film 218 may include an insulation (or dielectric) material that has a small dielectric constant relative to the dielectric constant of the surface insulation layer 214 (i.e., the spacer film 218 may contain an insulation material having a dielectric constant identical to or lower than the dielectric constant of a silicon oxide such as silicon carbide or silicon oxy-carbide). The spacer film 218 may be non-isotropically etched away to form the spacers 218a on sidewalls of the gate pattern 212 as shown in FIGS. 7A and 7B.

To form the transistor of FIG. 7A, impurity ions may be injected into the substrate 200 using the gate pattern 212 and the spacers 218a as an ion implantation mask to form the impurity-doped regions 220. As such, the transistor of FIG. 7A is completed. The surface insulation layer 214 on the impurity-doped regions 220 may be removed after the spacers 218a are formed. To form the transistor of FIG. 7B, the ion implantation process using the gate pattern 212 and the spacers 218a as a mask is not performed.

The above described operations may also be used to form the transistors associated with the selection gate patterns 258, of FIGS. 8 and 9. The selection gate patterns 258, 268 and the common source and drain regions 260, 270 may be formed using well-known processing techniques. The first and second selection inversion layers 216' and 216" may be formed at the same time that the inversion layers 216 are formed (and in the same manner).

In the above-described semiconductor transistors, the surface insulation layer 214 generates the inversion layer 216. The inversion layer 216 may facilitate minimizing the short channel effect in the transistor. As the surface insulation layer 214 may be very thin, the parasitic capacitances described with reference to FIG. 7A may be minimized. Therefore, characteristic deterioration due to the short channel effect can be reduced even when the transistor has a small line width.

THIRD EMBODIMENTS

The third embodiments of the present invention are directed to semiconductor devices such as, for example, a Dynamic Random Access memory device, that include transistors according to embodiments of the present invention.

Figure 13:
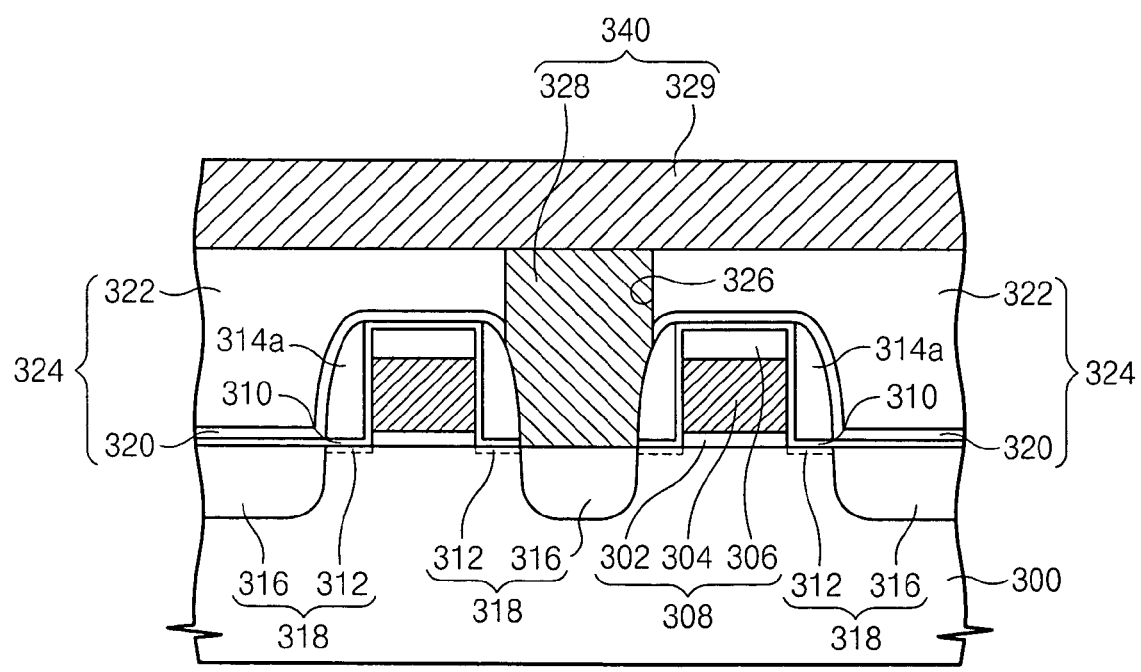
FIG. 13 is a cross-sectional diagram illustrating a semiconductor transistor according to third embodiments of the present invention.

FIG. 13 is a cross-sectional diagram illustrating a semiconductor device (i.e., a DRAM) that has transistors in accordance with third embodiments of the present invention.

As shown in FIG. 13, a pair of gate patterns 308 are provided on a substrate 300. The gate patterns 308 each include a gate insulation pattern 302, a gate electrode 304, and a capping pattern 306 that are sequentially stacked. The gate insulation pattern 302 may be formed of a silicon oxide film, specifically a thermal oxide film. The gate electrode 304 may be formed of a conductive film such as, for example, a doped polysilicon or a conductive metal-containing material. The capping pattern 306 may be formed of an insulation (or dielectric) material, such as, for example, silicon oxide or silicon nitride.

Spacers 314a are disposed on the sidewalls of the gate patterns 308. A surface insulation layer 310 is provided between the spacers 314a and the substrate 300. The surface insulation layer 310 contacts directly to the substrate 300. The surface insulation layer 310 may be formed of the same material as the surface insulation layer 110 of FIG. 2, and may generate a plurality of surface states at an interface between the substrate 300 and the surface insulation layer 310. These surface states induce an inversion layer 312 in the substrate 300 under the surface insulation layer 310. When a channel is generated under a gate pattern 308 by applying an operation voltage to the gate pattern 308, the inversion layer 312 is electrically conductive with the channel.

An impurity-doped region 316 is formed in the substrate 300 at each side of the gate patterns 308. The impurity-doped region 316 and the inversion layer 312 together form a source/drain region 318. The inversion layer 312 may have a resistance that is similar to or higher than the resistance of the impurity-doped region 316. In other words, the source/drain region 318 may be constructed to have either an LDD or an extended source/drain architecture.

The charge density (and hence the resistance) of the inversion layer 312 is a function of the density of the surface states. As the density of the surface states increases, the charge density of the inversion layer 312 increases and the resistance of the inversion layer 312 is reduced. As the density of the surface states decreases, the charge density of the inversion layer 312 decreases and the resistance of the inversion layer 312 increases.

As noted above, the density of the surface states tends to not be a function of the thickness of the surface insulation layer 310. Thus, the surface insulation layer 310 may have a very small thickness of about several angstroms through about several tens of angstroms.

When the substrate 300 is a P-type substrate, the surface insulation layer 310 may be formed of a material that generates surface states that electrically inverse the surface of the P-type substrate 300. For example, the surface insulation layer 310 may be formed of Hf-rich hafnium oxide, Zr-rich zirconium oxide, or silicon nitride. In embodiments in which the surface insulation layer 310 is formed of Hf-rich hafnium oxide or Zr-rich zirconium oxide, the larger the amount of Hf or Zr in the hafnium oxide or the zirconium oxide, respectively, the higher the density of the surface states.

When the substrate 300 is an N-type substrate, the surface insulation layer 310 may be formed of a material that generates surface states that electrically inverse the surface of the N-type substrate 300. For example, the surface insulation layer 310 may be made of Al-rich aluminum oxide. The larger the amount of Al in the aluminum oxide, the higher the density of the surface states.

The end of the surface insulation layer 310 that is adjacent to the gate patterns 308 may optionally be extended to be interposed between the sidewall of the gate patterns 308 and the spacer(s) 314a and/or may cover the tops of the gate patterns 308. The other end of the surface insulation layer 310 may be extended laterally to cover the impurity-doped region 316 as illustrated in FIG. 13.

The spacer(s) 314a may include an insulation (or dielectric) material that has a small dielectric constant relative to the dielectric constant of the surface insulation layer 310. For example, the spacer 314a may include an insulation material that has a dielectric constant that is identical to or lower than the dielectric constant of a silicon oxide (e.g., silicon carbide or silicon oxy-carbide).

An insulation film 324 may be deposited on the substrate 300, the gate patterns 308, the spacers 314a, and the impurity-doped regions 316. The insulation film 308 may comprise a material having an etch ratio with respect to the spacers 314a. Further, the insulation film 324 may comprise a material having a low dielectric constant. The insulation film 324 may be a single layer or a multi-layer insulator. In the particular embodiment depicted in FIG. 13, the insulation film 324 includes a bottom layer 320 and a top layer 322 that are sequentially stacked. The bottom layer 320 may have a different etch rate than the top layer 322, and, the bottom layer 320 may have an etch selection ratio against the spacer 314a.

A contact hole 326 is provided that penetrates the insulation film 324 to expose a source/drain region 318. The source/drain region 318 is shared by a pair of transistors. The contact hole 326 exposes only the impurity-doped region 316 of the source/drain region 318. The contact hole 326 may be formed to partially expose the spacer 314a. In other words, the contact hole 326 may be formed to be aligned to the spacer 314a.

A bitline 340 is disposed on the insulation film 324 and in the contact hole 326. The bitline 340 may include a plug part 328 that fills the contact hole 326 and a line part 329 that is provided on the insulation film 324 in the pattern of line. The plug and line parts, 328 329, are made of conductive materials. The plug and line parts, 328 and 329, may be made of the same conductive material or of different conductive materials.

In the transistors of the device of FIG. 13, the inversion layer 318 may be relatively thin (e.g., less than about 30 angstroms). The surface insulation layer 310 may also be relatively thin so to not impart significant physical stress on the substrate 300. Furthermore, although the dielectric constant of the surface insulation layer 310 may be higher, the parasitic capacitances between the gate electrode 304 and the source/drain region 318, and between the gate electrodes 304 forming one pair, can be reduced and/or minimized by the thin nature of the surface insulation layer 310.

Furthermore, the parasitic capacitance between the gate electrode 304 and the bitline 340 may also be reduced because the surface insulation layer 310 may be thin and/or because the spacer 314a includes a low-dielectric insulation material. Therefore, a sensing margin of the DRAM device may be increased to lengthen a refresh time therein in certain embodiments of the present invention. And, it may facilitate reducing the power consumption of the DRAM device.

Figure 14:
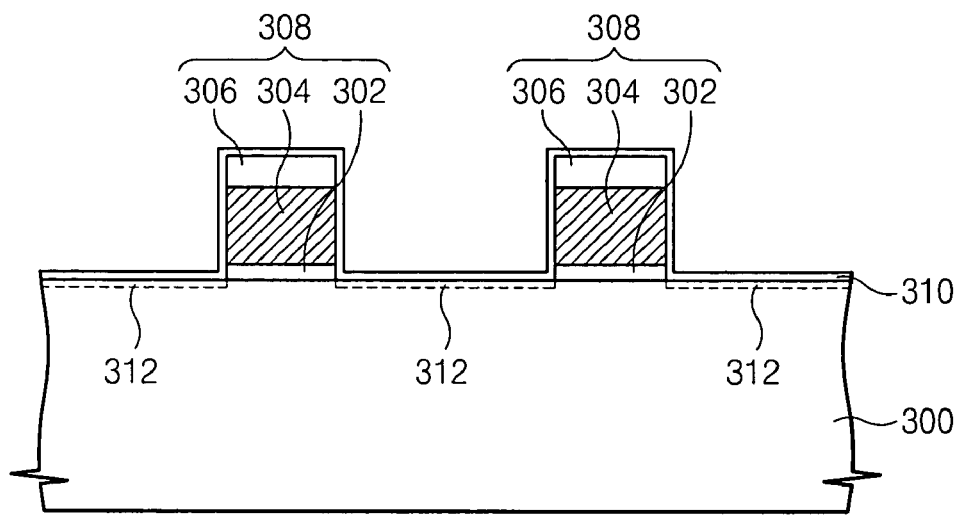
FIGS. 14 through 16 are cross-sectional diagrams illustrating processing steps for fabricating an exemplary semiconductor transistor in accordance with the third embodiments of the present invention.
Figure 15:
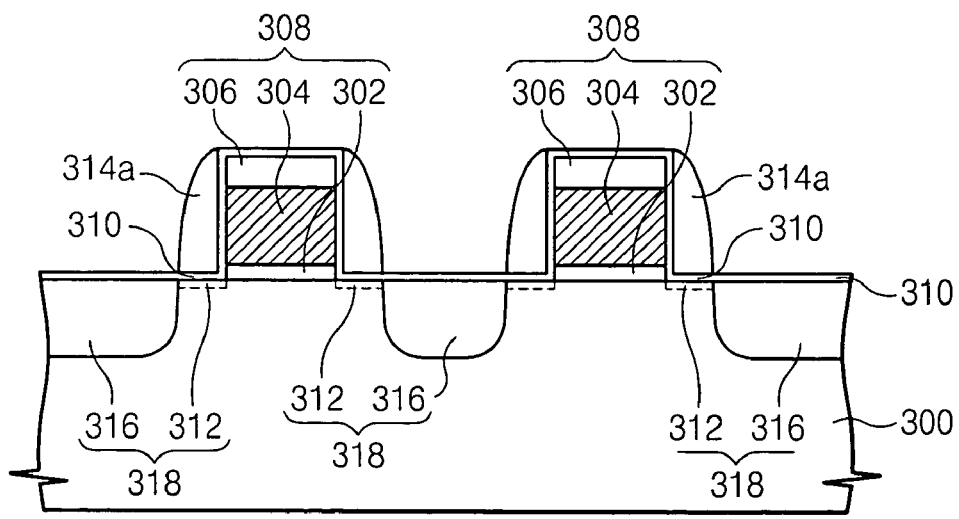
Figure 16:
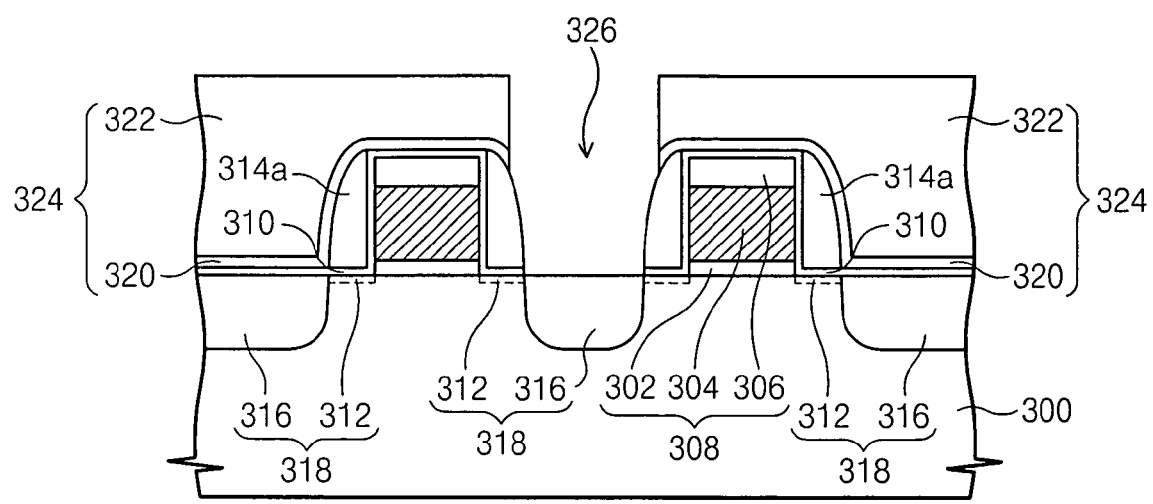

FIGS. 14 through 16 are cross-sectional diagrams illustrating processing steps for fabricating the semiconductor device of FIG. 13.

As shown in FIG. 14, the gate patterns 308 are formed on the substrate 300. The gate patterns 308 include the gate insulation pattern 302, the gate electrode 304, and the capping pattern 306. During or after formation of the gate patterns, the substrate 300 at both sides of the gate pattern 308 may be exposed. Next, the surface insulation layer 308 may be formed by, for example, conformally depositing an insulation layer on the substrate 300 at both sides of the gate pattern 308. The surface insulation layer 310 may be made of a material generating the surface states at an interface between the substrate 300 and the surface insulation layer 310. The surface states electrically inverse the surface of the substrate 300, generating the inversion layer 312 at the surface of the substrate 300 under the surface insulation layer 310. The surface insulation layer 310 may be formed to be very thin. For instance, the surface insulation layer 310 may have a thickness, for example, in the range of about several angstroms through about several tens of angstroms.

In some embodiments, the surface insulation layer 310 may cover the top and sidewalls of the gate patterns 308. In other embodiments, the surface insulation layer 310 may be formed only on the exposed surface of the substrate 300 at both sides of the gate patterns 308.

When the substrate 300 is a P-type substrate, the surface insulation layer 310 may be formed of a material generating surface states that inverse the surface of the P-type substrate 300. For example, the surface insulation layer 310 may be made of Hf-rich hafnium oxide, Zr-rich zirconium oxide, or silicon nitride. When the substrate 300 is an N-type substrate, the surface insulation layer 310 may be formed of a material generating surface states that electrically inverse the surface of the N-type substrate 300. For example, the surface insulation layer 310 may be made of Al-rich aluminum oxide.

As shown in FIG. 15, spacers 314a are formed on sidewalls of the gate patterns 308. Impurity ions may then be injected into the substrate 300 using the gate pattern 308 and the spacers 314a as a mask to form the impurity-doped regions 316. The inversion layer 312 and the impurity-doped region 316 constitute the source/drain region 318. The surface insulation layer 310 may partially remain on the impurity-doped regions 316. Otherwise, the surface insulation layer 310 on the impurity-doped regions 316 may be removed after forming the spacers 314a.

As shown in FIG. 16, an insulation film 324 is deposited on the substrate 300. In this embodiment, the insulation film 324 includes bottom and top layers 320, 322 that are sequentially stacked. The bottom layer 320 may comprise a material having an etch selection ratio against the spacer 314a such as, for example, silicon nitride or silicon oxynitride. The top layer 322 may comprise an insulation material having an etch selection ratio against the bottom layer 320, or having a low-dielectric constant. For instance, the bottom layer 322 may be formed of silicon oxide or silicon carbide.

A contact hole 326 may be formed by patterning the insulation film 324 between the gate patterns 308. The contact hole 326 may be self-aligned with the spacers 314a. The contact hole 326 may be formed by etching the bottom layer 320 after patterning the top layer 322 while using the bottom layer 320 as an etch stopper.

Completing the bitline 340, the structure of the semiconductor device shown in FIG. 13 is implemented.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device comprising:
    a gate pattern on a substrate;
    a surface insulation layer on the substrate;
    a spacer on the surface insulation layer and on a sidewall of the gate pattern, wherein the spacer comprises an insulation material; and
    an inversion layer in a surface region of the substrate under the surface insulation layer and the spacer, wherein the surface insulation layer comprises a material that generates surface states at an interface between the substrate arid the surface insulation layer;
    wherein the surface insulation layer is directly on the substrate under the spacer, and wherein the semiconductor device further comprises a gate dielectric under the gate pattern, wherein the gate dielectric and the surface insulation layer comprise different materials.

2. The semiconductor device of claim 1, wherein the substrate is a P-type substrate and wherein the surface insulation layer comprises a material that generates surface states that electrically inverse the P-type substrate.

3. The semiconductor device of claim 2, wherein the surface insulation layer includes Hf-rich hafnium oxide, Zr-rich zirconium oxide, and/or silicon nitride.

4. The semiconductor device of claim 1, wherein the substrate is an N-type substrate and the surface insulation layer comprises a material that generates surface states that electrically inverse the N-type substrate.

5. The semiconductor device of claim 4, wherein the surface insulation layer comprises Al-rich aluminum oxide.

6. A semiconductor device comprising:
    a gate pattern on a substrate;
    a surface insulation layer on the substrate;
    a spacer on the surface insulation layer and on a sidewall of the gate pattern, wherein the spacer comprises an insulation material; and
    an inversion layer in a surface region of the substrate under the surface insulation layer and the spacer, wherein the surface insulation layer comprises a material that generates surface states at an interface between the substrate and the surface insulation layer
    wherein the spacer comprises an insulation material having a dielectric constant that is lower than a dielectric constant of the surface insulation layer.

7. The semiconductor device of claim 1, further comprising an impurity-doped region in the substrate at a side of the gate pattern, and wherein the inversion layer is between,and electrically connected to, the impurity-doped region and a channel region under the gate pattern.

8. The semiconductor device of claim 7, further comprising:
    an insulation layer on the gate pattern, the spacer, and the impurity-doped region;
    a contact plug that penetrates the insulation layer to make electrical contact with the impurity-doped region; and
    a bitline on the insulation layer and the contact plug.

9. The semiconductor device of claim 7, wherein the surface insulation layer extends laterally onto the impurity-doped region.

10. The semiconductor device of claim 6, wherein the surface insulation layer and the inversion layer extend laterally along the surface of the substrate opposite the gate pattern so as to extend laterally beyond the spacer.

11. The semiconductor device of claim 1, wherein the gate pattern comprises a charge storage pattern, a blocking insulation pattern, and a control gate electrode that are sequentially stacked on the substrate.

12. The semiconductor device of claim 6, wherein the surface insulation layer has a thickness in the range of about 3 angstroms to about 30 angstroms.

13. A semiconductor transistor, comprising:
    a gate pattern on a semiconductor layer;
    a surface insulation layer directly on at least a portion of the semiconductor layer;
    a first spacer on the surface insulation layer and on a first sidewall of the gate pattern;

a first source/drain region, the first source/drain region comprising a first inversion layer in the semiconductor layer under the first spacer;

wherein the surface insulation layer comprises a material that generates surface states at an interface between the semiconductor layer and the surface insulation layer; and wherein the surface insulation layer comprises Hf-rich hafnium oxide, Zr-rich zirconium oxide and/or Al-rich aluminum oxide.

14. A semiconductor transistor, comprising:

a gate pattern on a semiconductor layer;

a surface insulation layer directly on at least a portion of the semiconductor layer;

a first spacer on the surface insulation layer and on a first sidewall of the gate pattern;

a first source/drain region, the first source/drain region comprising a first inversion layer in the semiconductor layer under the first spacer;

wherein the surface insulation layer comprises a material that generates surface states at an interface between the semiconductor layer and the surface insulation layer;

wherein the surface insulation layer comprises Hf-rich hafnium oxide, Zr-rich zirconium oxide, silicon nitride and/or Al-rich aluminum oxide;

wherein the spacer comprises an insulation material;

wherein the semiconductor layer comprises a silicon substrate; and wherein the transistor further comprises a gate dielectric under the gate pattern, wherein the gate dielectric and the surface insulation layer comprise different materials.

15. The semiconductor transistor of claim 14, further comprising;

a second spacer on the surface insulation layer and on a second sidewall of the gate pattern that is opposite the first sidewall; and a second source/drain region, the second source/drain region comprising a second inversion layer in the semiconductor layer under the second spacer.

16. The semiconductor transistor of claim 15, wherein the first source/drain region further comprises a first impurity-doped region in the semiconductor layer that is electrically connected to a channel region in the semiconductor layer through the first inversion layer and, wherein the second source/drain region further comprises a second impurity-doped region in the semiconductor layer that is electrically connected to the channel region through the second inversion layer.

17. The semiconductor transistor of claim 16, wherein the surface insulation layer has a thickness in the range of about 3 angstroms to about 30 angstroms.

18. The semiconductor transistor of claim 13, wherein the first source/drain region consists essentially of the first inversion layer.

19. A semiconductor transistor, comprising:

a gate pattern on a semiconductor layer;

a surface insulation layer directly on at least a portion of the semiconductor layer;

a first spacer on the surface insulation layer and on a first sidewall of the gate pattern;

a first source/drain region, the first source/drain region comprising a first inversion layer in the semiconductor layer under the first spacer;

wherein the surface insulation layer comprises a material that generates surface states at an interface between the semiconductor layer and the surface insulation layer;

wherein the first spacer comprises an insulation material having a dielectric constant that is lower than a dielectric constant of the surface insulation layer.

20. The semiconductor device of claim 19, wherein the surface insulation layer and the first inversion layer extend laterally along the surface of the semiconductor layer opposite the gate pattern so as to extend laterally beyond the first spacer.

21. The semiconductor device of claim 19, wherein the gate pattern comprises a tunnel insulation pattern, a charge storage pattern, a blocking insulation pattern, and a control gate electrode that are sequentially stacked on the substrate.

22. A semiconductor device, comprising:

a gate pattern on a substrate;

a surface insulation layer directly on at least a portion of the substrate, wherein the surface insulation layer comprises Hf-rich hafnium oxide, Zr-rich zirconium oxide, silicon nitride and/or Al-rich aluminum oxide;

a spacer on the surface insulation layer and on a first sidewall of the gate pattern, wherein the first spacer comprises an insulation material having a dielectric constant that is lower than a dielectric constant of the surface insulation layer; and a source/drain region under the first spacer;

wherein the source/drain region comprises an inversion layer in the substrate that results from surface states generated by the surface insulation layer at the interface between the substrate and the surface insulation layer.

23. The semiconductor device of claim 22, wherein the source/drain region further comprises an impurity-doped region in the semiconductor layer that is electrically connected to a channel region in the substrate through the inversion layer.

24. The semiconductor device of claim 22, wherein the surface insulation layer has a thickness in the range of about 3 angstroms to about 30 angstroms.

25. The semiconductor device of claim 22, wherein the source/drain region consists essentially of the inversion layer.

26. A method of fabricating semiconductor device, the method comprising:

forming a gate pattern on a substrate;

forming a surface insulation layer directly on the substrate at a side of the gate pattern;

forming an insulative spacer on a sidewall of the gate pattern and on the surface insulation layer, wherein the surface insulation layer is formed of a material that generates surface states at an interface between the substrate and the surface insulation layer and an inversion layer is formed in a surface region of the substrate under the surface insulation layer;

wherein the spacer includes an insulation material with a dielectric constant that is lower than the dielectric constant of the surface insulation layer.

27. The method of claim 26, wherein the substrate is a P-type substrate and wherein the surface insulation layer is formed of a material that generates surface states that electrically inverse the P-type substrate.

28. The method of claim 27, wherein the surface insulation layer is formed of Hf-rich hafnium oxide, Zr-rich zirconium oxide and/or silicon nitride.

29. A method of fabricating semiconductor device, the method comprising:

forming a gate pattern on a substrate;

forming a surface insulation layer directly on the substrate at a side of the gate pattern; and forming an insulative spacer on a sidewall of the gate pattern and on the surface insulation layer, wherein the surface insulation layer is formed of a material that generates surface states at an interface between the substrate and the surface insulation layer and an inversion layer is formed in a surface region of the substrate under the surface insulation layer;

wherein the substrate is an N-type substrate and the surface insulation layer is formed of a material that generates surface states that electrically inverse the N-type substrate; and wherein the surface insulation layer is formed of Al-rich aluminum oxide.

30. The method of claim 26, wherein forming the gate pattern on the substrate comprises sequentially forming a tunnel insulation pattern, a charge storage pattern, a blocking insulation pattern, and a control gate electrode on the substrate.

31. The method of claim 26, wherein forming the surface insulation layer further comprises forming the surface insulation layer to have a thickness in the range of about 3 angstroms to about 30 angstroms.

32. The method of claim 26, further comprising forming an impurity-doped region having a first end that is aligned with the spacer.

* * * * *

UNITED STATES PATENT AND TRADEMARK OFFICE
CERTIFICATE OF CORRECTION

PATENT NO. : 7,492,006 B2
APPLICATION NO. : 11/215217
DATED : February 17, 2009
INVENTOR(S) : Buh et al.

Page 1 of 1

It is certified that error appears in the above-identified patent and that said Letters Patent is hereby corrected as shown below:

Column 18, Claim 1, Line 2: Please correct "arid" to read -- and --

Signed and Sealed this

Fourteenth Day of April, 2009

JOHN DOLL
*Acting Director of the United States Patent and Trademark Office*